(12) United States Patent
Lee et al.

(10) Patent No.: US 7,791,100 B2
(45) Date of Patent: Sep. 7, 2010

(54) VERTICAL GALLIUM NITRIDE BASED LIGHT EMITTING DIODE WITH MULTIPLE ELECTRODE BRANCHES

(75) Inventors: Su Yeol Lee, Seongnam (KR); Dong Woo Kim, Seoul (KR); Seok Beom Choi, Daejeon (KR); Tae Jun Kim, Pyeongtaek (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/602,285

(22) Filed: Nov. 21, 2006

(65) Prior Publication Data

US 2007/0114564 A1    May 24, 2007

(30) Foreign Application Priority Data

Nov. 24, 2005    (KR) ...................... 10-2005-0112711

(51) Int. Cl.
*H01L 33/00* (2010.01)
(52) U.S. Cl. ........................... 257/103; 257/94; 257/98; 257/E33.006; 257/E33.065
(58) Field of Classification Search ................ 257/103, 257/E33.006, E33.065, E33.068, E33.074, 257/94, 98
See application file for complete search history.

(56) References Cited

U.S. PATENT DOCUMENTS

| 5,779,924 A | 7/1998 | Krames et al. |
| 2003/0122145 A1* | 7/2003 | Linder et al. ................... 257/99 |
| 2004/0084684 A1* | 5/2004 | Tarsa et al. ..................... 257/91 |
| 2004/0140474 A1 | 7/2004 | Ueda et al. |
| 2005/0148194 A1* | 7/2005 | Lan et al. ..................... 438/706 |
| 2005/0173717 A1* | 8/2005 | Lee et al. ....................... 257/98 |

FOREIGN PATENT DOCUMENTS

| JP | 2002-026386 | 1/2002 |
| JP | 2002-164574 | 6/2002 |
| JP | 2004-087930 | 3/2004 |
| JP | 2004-088083 | 3/2004 |
| JP | 2004-193338 | 7/2004 |

OTHER PUBLICATIONS

Japanese Office Action, w/ English translation thereof, issued in Japanese Patent Application No. JP 2006-317152 dated May 18, 2010.

* cited by examiner

*Primary Examiner*—Lynne A Gurley
*Assistant Examiner*—Vernon P Webb
(74) *Attorney, Agent, or Firm*—McDermott Will & Emery LLP

(57) ABSTRACT

A vertical GaN-based LED includes an n-type bonding pad; an n-electrode formed under the n-type bonding pad; a light-emitting structure formed by sequentially laminating an n-type GaN layer, an active layer, and a p-type GaN layer under the n-electrode; a p-electrode formed under the light-emitting structure; and a support layer formed under the p-electrode. The light-emitting structure has or or more trenches which are spaced at a predetermined distance with the n-electrode from the outermost side of the light-emitting structure and in which the active layer of the light-emitting structure is removed.

4 Claims, 4 Drawing Sheets

[FIG. 1]
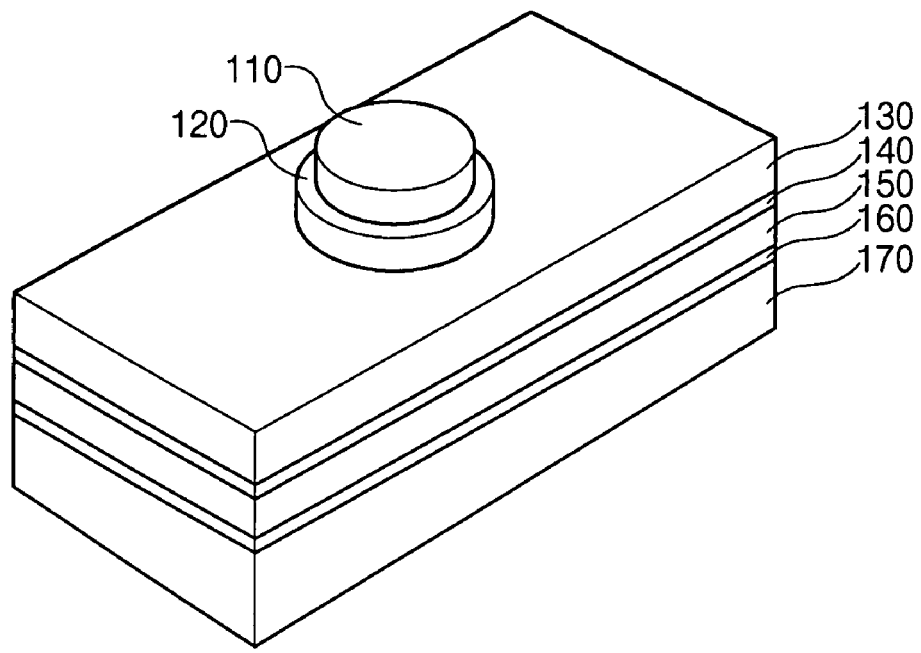
[FIG. 2]
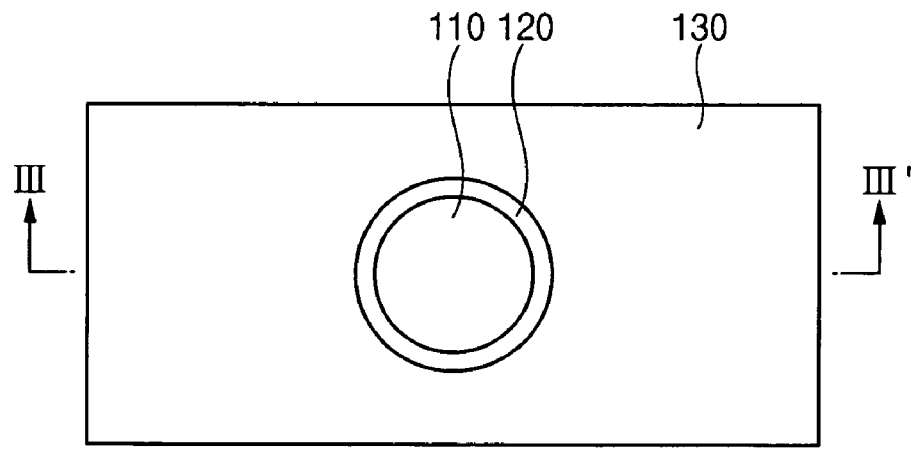
[FIG. 3]
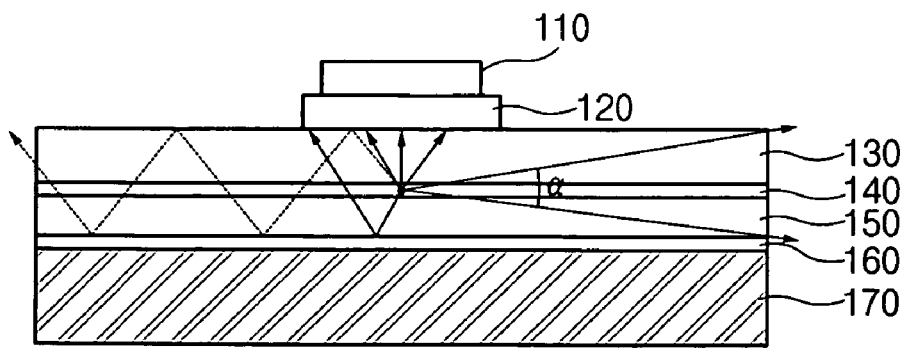

[FIG. 4]
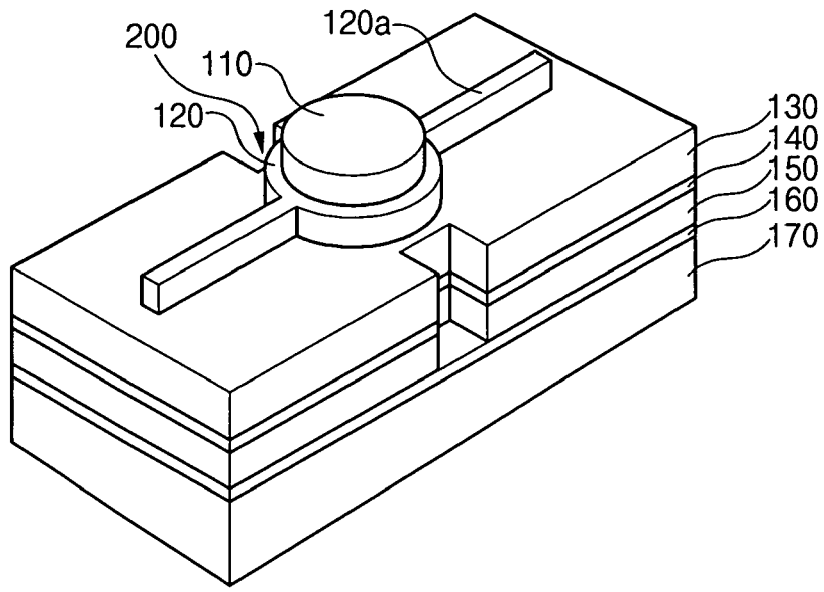
[FIG. 5]
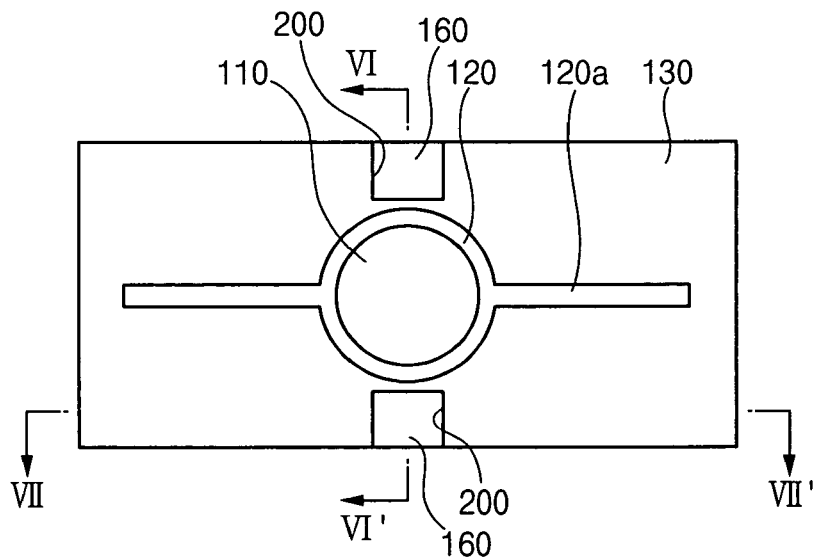
[FIG. 6]
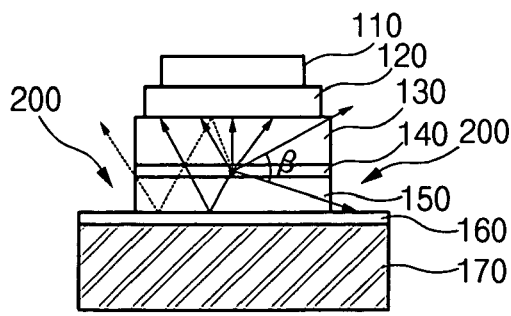

[FIG. 7]
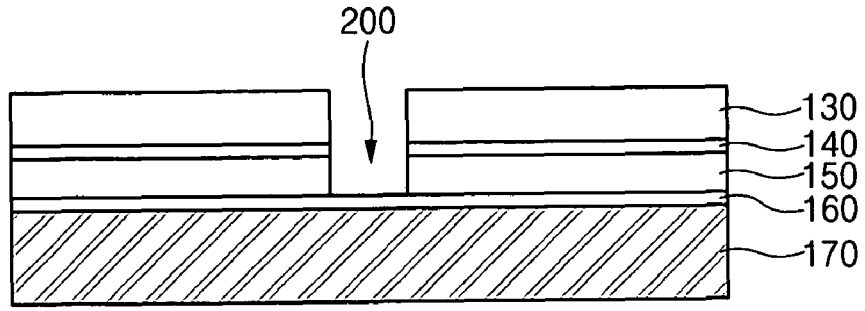
[FIG. 8]
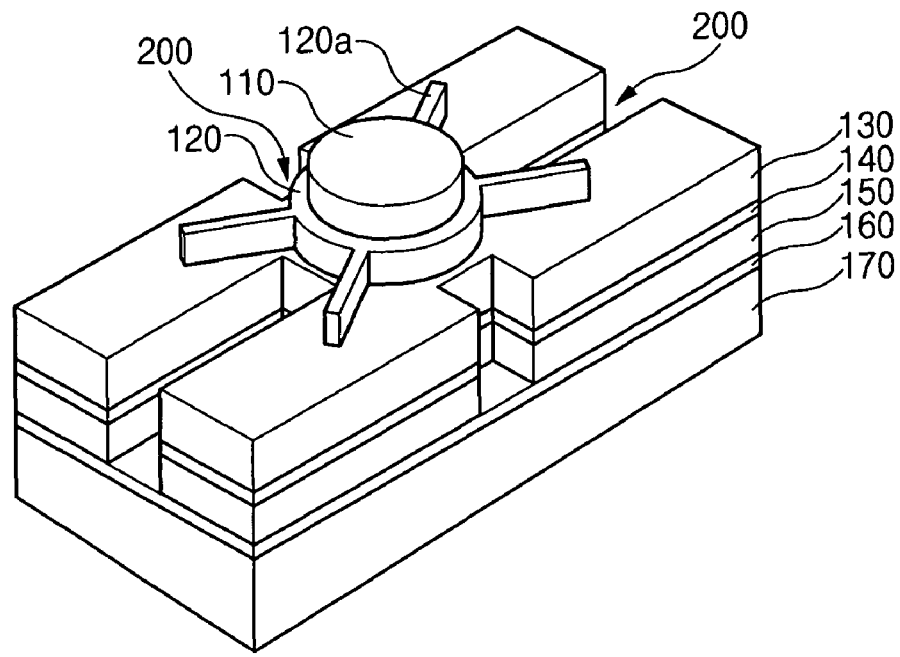
[FIG. 9]
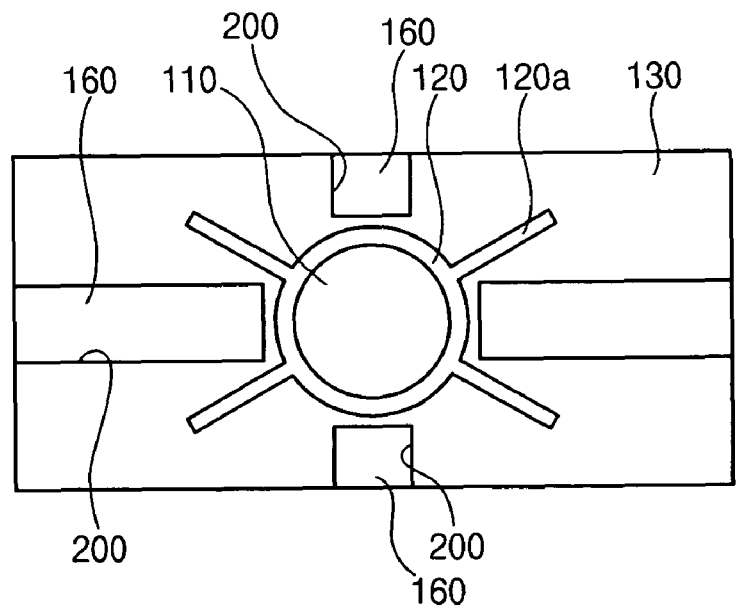

[FIG. 10]
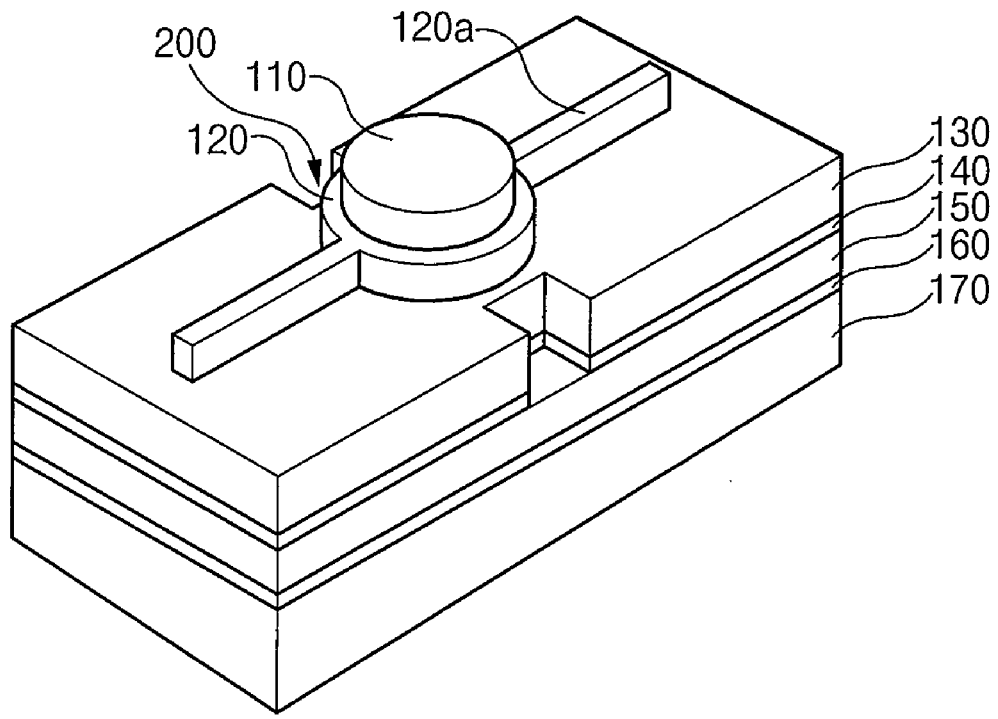
[FIG. 11]
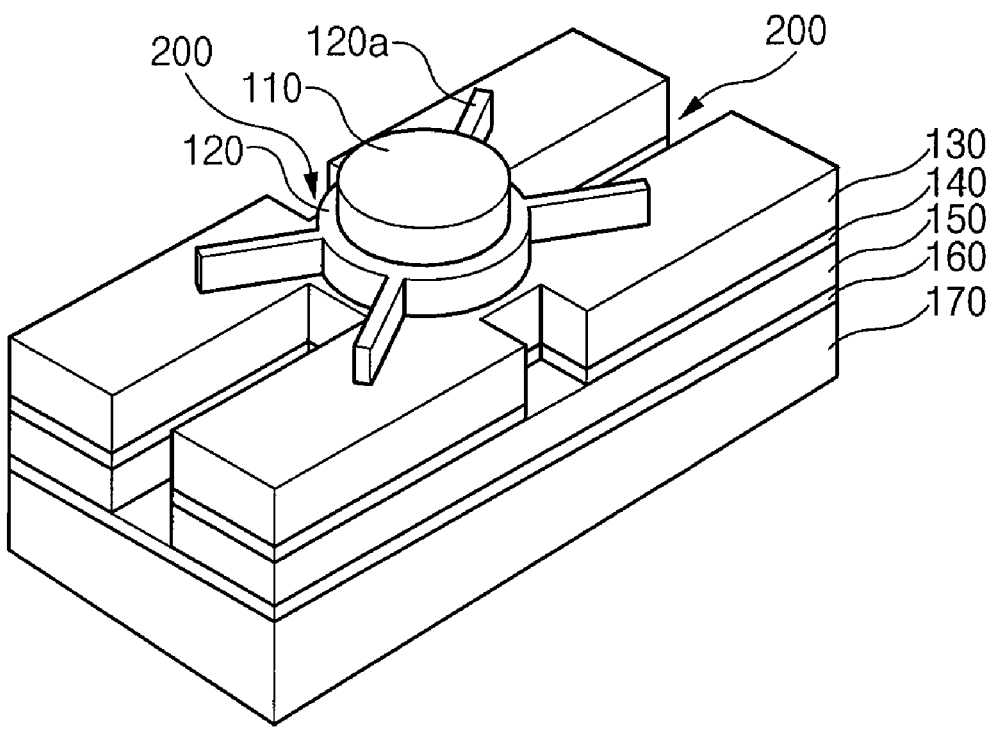

VERTICAL GALLIUM NITRIDE BASED LIGHT EMITTING DIODE WITH MULTIPLE ELECTRODE BRANCHES

CROSS-REFERENCE TO RELATED APPLICATIONS

The application claims the benefit of Korea Patent Application No. 2005-112711 filed with the Korea Intellectual Property Office on Nov. 24, 2005, the disclosure of which is incorporated herein by reference.

BACKGROUND OF THE INVENTION

1. Field of the Invention

The present invention relates to a vertical (vertical-electrode-type) GaN-based light emitting diode (hereinafter, referred to as 'LED'), which can minimize a loss of photons generated in an active layer so as to increase the light-extraction efficiency, thereby increasing external quantum efficiency.

2. Description of the Related Art

Generally, a GaN-based LED is grown on a sapphire substrate, but the sapphire substrate is a rigid nonconductor and has poor thermal conductivity. Therefore, there is a limitation in reducing the manufacturing costs by decreasing the size of a GaN-based LED, or improving the optical power and chip characteristic. Particularly, because the application of a high current is essential for achieving high power LED, it is important to solve a heat-sink problem of the LED. To solve this problem, there has been proposed a vertical GaN-based LED in which a sapphire substrate is removed using a laser lift-off (LLO).

However, the conventional vertical GaN-based LED has a problem in that photons generated from an active layer are emitted to the outside of the LED. That is, the external quantum efficiency is degraded.

Now, the problem of the conventional vertical GaN-based LED will be described in detail with reference to FIGS. 1 to 3.

FIG. 1 is a perspective view illustrating the structure of the conventional vertical GaN-based LED. FIG. 2 is a plan view illustrating the structure of the vertical GaN-based LED of FIG. 1. FIG. 3 is a sectional view illustrating the structure of the vertical GaN-based LED, taken along III-III' line of FIG. 2.

Referring to FIGS. 1 to 3, the conventional vertical GaN-based LED includes an n-type bonding pad 110, an negative (n-) electrode 120 formed under the n-type bonding pad 110, an n-type GaN layer 130 formed under the n-electrode 120, an active layer 140 formed under the n-type GaN layer 130, a p-type GaN layer 150 formed under the active layer 150, and a positive (p-) electrode 160 formed under the p-type GaN layer 150, and a support layer 170 formed under the p-electrode 160.

The n-electrode 120 and p-electrode 160 not only serve as an electrode, but also serve to reflect light. Therefore, the n-electrode 120 and p-electrode 160 are preferably formed of metal with high reflectance.

In the conventional vertical GaN-based LED, photons generated in the active layer 140 are directly emitted to a light emitting surface or are totally reflected into the light emitting surface by the p-electrode 160 formed under the active layer 140 so as to be emitted, as shown in FIG. 3.

However, when the photons are totally reflected into the light emitting surface through the p-electrode 160, a loss of light generated in the active layer can occur. More specifically, the conventional vertical GaN-based LED has a path where light generated in the active layer is emitted into the light emitting surface, and a horizontal path is longer than a vertical path. Therefore, photons emitted to the side of the LED are absorbed or scattered while being totally reflected between the p-electrode and the light emitting surface.

In other words, since horizontal paths of the active layer, the p-type GaN layer, and the n-type GaN layer are long in the conventional vertical GaN-based LED, a critical angle α at which light is laterally emitted is so small that a loss of photons is inevitably caused by the total reflection between the p-electrode and the light emitting surface. Therefore, the external quantum efficiency decreases.

SUMMARY OF THE INVENTION

An advantage of the present invention is that it provides a vertical GaN-based LED, in which a horizontal path where photons generated in an active layer are laterally emitted is shortened so that the number of total reflections of photons between a p-electrode and a light emitting surface is reduced, and a critical angle is enlarged to maximize an improved effect of the external quantum efficiency.

Additional aspects and advantages of the present general inventive concept will be set forth in part in the description which follows and, in part, will be obvious from the description, or may be learned by practice of the general inventive concept.

According to an aspect of the invention, a vertical GaN-based LED includes an n-type bonding pad; an n-electrode formed under the n-type bonding pad; a light-emitting structure formed by sequentially laminating an n-type GaN layer, an active layer, and a p-type GaN layer under the n-electrode; a p-electrode formed under the light-emitting structure; and a support layer formed under the p-electrode. The light-emitting structure has or or more trenches which are spaced at a predetermined distance with the n-electrode from the outermost side of the light-emitting structure and in which the active layer of the light-emitting structure is removed.

According to another aspect of the invention, the n-electrode includes one or more negative branch electrodes extending in a direction where the negative branch electrodes are not overlapped with the trenches, the negative branch electrode being formed on the light-emitting structure adjacent to the trench.

According to a further aspect of the invention, when the light-emitting structure has more than two trenches, the trenches adjacent to each other around the n-electrode are disposed so as to be spaced at a uniform distance.

According to a still further aspect of the invention, the trench is formed by mesa-etching the n-type GaN layer and the active layer of the light-emitting structure.

According to a still further aspect of the invention, the trench is formed by mesa-etching the n-type GaN layer, the active layer, and the p-type GaN layer of the light-emitting structure.

According to a still further aspect of the invention, the n-type and p-electrodes are composed of a conductive body with high reflectance.

According to a still further aspect of the invention, the n-type or p-electrode is formed to have such a structure that a transparent electrode and a reflecting electrode are sequentially laminated.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a perspective view illustrating the structure of a conventional vertical GaN-based LED;

FIG. 2 is a plan view illustrating the structure of the vertical GaN-based LED of FIG. 1;

FIG. 3 is a sectional view illustrating the structure of the conventional vertical GaN-based LED, taken along III-III' line of FIG. 2.

FIG. 4 is a perspective view illustrating the structure of a vertical GaN-based LED according to a first embodiment of the present invention;

FIG. 5 is a plan view illustrating the structure of the vertical GaN-based LED of FIG. 4;

FIG. 6 is a sectional view illustrating the vertical GaN-based LED, taken along VI-VI' line of FIG. 5.

FIG. 7 is a sectional view illustrating the vertical GaN-based LED, taken along VII-VII' line of FIG. 5.

FIG. 8 is a perspective view illustrating the structure of a vertical GaN-based LED according to a second embodiment of the invention; and FIG. 9 is a plan view illustrating the structure of the vertical GaN-based LED of FIG. 8.

FIG. 10 is a perspective view illustrating the structure of a vertical GaN-based LED according to a third embodiment of the present invention.

FIG. 11 is a perspective view illustrating the structure of a vertical GaN-based LED according to a fourth embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a vertical GaN-based LED according to an embodiment of the present invention will be described in detail with reference to the accompanying drawings.

First Embodiment

First, a vertical GaN-based LED according to a first embodiment of the invention will be described in detail with reference to FIGS. 4 to 7.

FIG. 4 is a perspective view illustrating the structure of the vertical GaN-based LED according to the first embodiment of the invention. FIG. 5 is a plan view illustrating the structure of the vertical GaN-based LED of FIG. 4. FIG. 6 is a sectional view illustrating the vertical GaN-based LED, taken along VI-VI' line of FIG. 5. FIG. 7 is a sectional view illustrating the vertical GaN-based LED, taken along VII-VII' line of FIG. 5.

As shown in FIGS. 4 to 7, an n-type bonding pad 110 for electrical connection with an external element is formed on the uppermost portion of the vertical GaN-based LED according to the first embodiment of the invention.

Under the n-type bonding pad 110, an n-electrode 120 for enhancing light efficiency is formed. Particularly, the n-electrode 120 includes one or more negative branch electrodes 120a extending therefrom, as shown in FIG. 5. Preferably, the negative branch electrode 120a is formed to extend in a direction where it is not overlapped with a trench 200 to be described below. The negative branch electrode 120a serves to make up for the reduction in current spreading effect at the end of a light-emitting structure, which is caused by the trench 200.

Preferably, the n-electrode 120 not only serves as an electrode, but also serves to reflect light. Accordingly, in this embodiment, the n-electrode 120 may be formed of a conductive body with high reflectance or may be formed to have such a structure (not shown) that a transparent electrode and a reflective electrode are sequentially laminated.

Under the n-electrode 120, an n-type GaN layer 130, an active layer 140, and a p-type GaN layer 150 are sequentially laminated, thereby composing a light-emitting structure.

The n-type GaN layer 130 of the light-emitting structure may be formed of a GaN layer or GaN/AlGaN layer doped with n-type impurities. The active layer 140 may be formed with a multi-quantum well structure composed of an InGaN/GaN layer. The p-type GaN layer 150 may be formed of a GaN layer or GaN/AlGaN layer doped with p-type impurities, similar to the n-type GaN layer 130.

The light-emitting structure according to this embodiment has one or more trenches 200 which are spaced at a predetermined distance with the n-electrode 120 from the outermost side of the light-emitting structure in order to shorten a horizontal path of photons generated in the active layer 140 and in which the active layer 140 of the light-emitting structure is removed. At this time, the trench 200 in which the active layer 140 of the light-emitting structure has been removed may be formed by mesa-etching the n-type GaN layer 130 and the active layer 140 of the light-emitting structure, or may be formed by mesa-etching the n-type GaN layer 130, the active layer 140, and the p-type GaN layer 150 of the light-emitting structure.

When the light-emitting structure has more than two trenches 200, it is preferable that the trenches 200 adjacent to each other around the n-electrode 120 are disposed so as to be spaced at a uniform distance therebetween, in order to enhance a current spreading effect. For example, when the light-emitting structure has two trenches 200 as shown in FIG. 5, the trenches 200 are respectively disposed so as to correspond to both sides of the n-electrode 120, thereby enhancing a current spreading effect.

In the light-emitting structure according to this embodiment, a horizontal path in which photons generated in the active layer are emitted laterally through the trench 200 formed therein is shortened as much as the width of the trench 200, compared with the horizontal path (see FIG. 3) of the vertical GaN-based LED according to the related art. Therefore, as shown in FIG. 6, the number of total reflections of photons, which are laterally emitted through the horizontal path, is further reduced in comparison with the number of total reflections in the vertical GaN-based LED according to the related art. Further, a critical angle β is enlarged more than the critical angle α according to the related art, which makes it possible to maximize the external quantum efficiency of laterally-emitted photons.

In this embodiment, the entire inner side wall of the light-emitting structure is exposed through the trench 200. That is, all the side walls of the n-type GaN layer 130, the active layer 140, and the p-type GaN layer 150 are exposed through the trench 200. Without being limited thereto, however, the trench 200 may be formed so that only the side walls of the n-type GaN layer 130 and the active layer 140 of the light-emitting structure are exposed.

Under the p-type GaN 150 of the light-emitting structure, a p-electrode 160 is formed. Preferably, the p-electrode 160 not only serves as an electrode, but also serves to reflect light, like the n-electrode 120. Therefore, the p-electrode 160 may be formed of a conductive body with high reflectance or may be formed to have such a structure (not shown) that a transparent electrode and a reflecting electrode are sequentially laminated.

Under the p-electrode 160, a support layer 170 is formed of a silicon substrate.

In this embodiment, a silicon substrate is exemplified as the support layer 170. Without being limited thereto, however, the support layer, which serves as an electrode and a final layer for supporting the LED, may be formed of a GaAs substrate, a Ge substrate, a plating layer or a metallic layer.

The metallic layer may be formed by thermal evaporation, e-beam evaporation, sputtering, chemical vapor deposition (CVD) or the like.

Second Embodiment

Referring to FIGS. 8 and 9, a second embodiment of the invention will be described. However, the descriptions of the same construction of the second embodiment as that of the first embodiment will be omitted, and only a different construction in the second embodiment will be described in detail.

FIG. 8 is a perspective view illustrating the structure of a vertical GaN-based LED according to the second embodiment. FIG. 9 is a plan view illustrating the structure of the vertical GaN-based LED of FIG. 8.

Referring to FIGS. 8 and 9, the vertical GaN-based LED according to the second embodiment has almost the same construction as that of the vertical GaN-based LED according to the first embodiment. In the vertical GaN-based LED according to the second embodiment, however, four trenches 200 exposing the inner side walls of the light-emitting structure are formed so as to correspond to four directions around the n-electrode 120, and four negative branch electrodes 120a extending from the n-electrode 120 in a direction where they are not overlapped with the trenches 200 are formed so as to increase a current spreading efficiency, which is different from the first embodiment in which two trenches and two negative branch electrodes are formed.

In the second embodiment, a bonding layer and a transparent layer are also included, similar to the first embodiment. Therefore, it is possible to obtain the same operation and effect as those of the first embodiment.

In the second embodiment, four trenches are formed to correspond to the respective sides of the light-emitting structure. Therefore, a horizontal path in which photons generated in the active layer are laterally emitted can be shortened in any side of the light-emitting structure, which makes it possible to further maximize the external quantum efficiency.

Third Embodiment

Referring to FIG. 10, the vertical GaN-based LED according to a third embodiment has similar construction as the vertical GaN-based LED illustrated in FIG. 4. In contrast to the embodiment illustrated in FIG. 4, although trench 200 in which the active layer 140 of the light-emitting structure has been removed is formed by mesa-etching the n-type GaN layer 130 and the active layer 140 of the light-emitting structure, trench 200 terminates over the p-type GaN layer 150.

Fourth Embodiment

Referring to FIG. 11, the vertical GaN-based LED according to a fourth embodiment has similar construction as the vertical GaN-based LED illustrated in FIG. 8. In contrast to the embodiment illustrated in FIG. 8, although trench 200 in which the active layer 140 of the light-emitting structure has been removed is formed by mesa-etching the n-type GaN layer 130 and the active layer 140 of the light-emitting structure, trench 200 terminates over the p-type GaN layer 150.

As described above, the horizontal path in which photons generated in the active layer are laterally emitted can be shortened through the trench formed inside the light-emitting structure, so that the number of total reflections of photons between the p-electrode and the light-emitting surface can be reduced. Further, a critical angle is enlarged to enhance a light-emission characteristic.

Therefore, it is possible to enhance the luminance by maximizing the external quantum efficiency of the vertical GaN-based LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A vertical GaN-based LED comprising:
   an n-type bonding pad;
   an n-electrode formed under the n-type bonding pad;
   a light-emitting structure formed by sequentially laminating an n-type GaN layer, an active layer, and a p-type GaN layer under the n-electrode;
   a p-electrode formed under the light-emitting structure; and
   a support layer formed under the p-electrode,
   wherein the light-emitting structure has one or more trenches which are spaced at a predetermined distance with the n-electrode from the outermost side of the light-emitting structure and in which the trenches run through the n type GaN layer and the active layer and terminate over the p-type GaN layer,
   and wherein the n-electrode includes one or more negative branch electrodes extending in a direction where the negative branch electrodes are not overlapped with the trenches, the negative branch electrodes being formed on the light-emitting structure adjacent to the trench.

2. The vertical GaN-based LED according to claim 1, wherein when the light-emitting structure has more than two trenches, the trenches adjacent to each other around the n-electrode are disposed so as to be spaced at a uniform distance.

3. The vertical GaN-based LED according to claim 1, wherein the n-type and p-electrodes are composed of a conductive body with high reflectance.

4. The vertical GaN-based LED according to claim 1, wherein the n-type or p-electrode is formed to have such a structure that a transparent electrode and a reflecting electrode are sequentially laminated.

* * * * *